(12) United States Patent
Liang

(10) Patent No.: US 7,643,273 B2
(45) Date of Patent: Jan. 5, 2010

(54) CONTROL DEVICE OF CONNECTION STUDS OF A COMPUTER

(75) Inventor: Chien-Fa Liang, Chung-Ho (TW)

(73) Assignee: Super Micro Computer, Inc., San Jose, CA (US)

( * ) Notice: Subject to any disclaimer, the term of this patent is extended or adjusted under 35 U.S.C. 154(b) by 623 days.

(21) Appl. No.: 11/594,241

(22) Filed: Nov. 8, 2006

(65) Prior Publication Data

US 2008/0105816 A1    May 8, 2008

(51) Int. Cl.
*G06F 1/16* (2006.01)
(52) U.S. Cl. .............................. 361/679.01; 312/223.2; 248/680
(58) Field of Classification Search ............ 361/679.01; 248/680
See application file for complete search history.

(56) References Cited

U.S. PATENT DOCUMENTS 4,964,017 A * 10/1990 Jindrick et al. ......... 361/679.32
5,235,493 A * 8/1993 Yu ......................... 361/679.31
5,684,674 A * 11/1997 Yin ............................ 361/695
6,714,410 B2 * 3/2004 Wellhofer .............. 361/679.01
7,301,756 B2 * 11/2007 Wayman ................ 361/679.01
7,374,259 B2 * 5/2008 Wu et al. ................. 312/223.2
7,566,104 B2 * 7/2009 Chen ....................... 312/223.2

* cited by examiner

Primary Examiner—Lisa Lea-Edmonds
(74) Attorney, Agent, or Firm—Jackson IPG PLLC

(57) ABSTRACT

A control device of connection studs of a computer includes a plurality of hexagonal grooves which are punched at different distances on a base plate of a computer casing. The groove is provided with a through-hole, hexagonal heads of a set of studs are loosely fitted into the hexagonal grooves, and rods of the studs are loosely transfixed into the through-holes, in order to screw with a circuit board of different size, such that a number of studs to be actually used for screwing can be effectively controlled, and an interference from the unnecessary studs, the circuit board, or other parts can be prevented.

3 Claims, 5 Drawing Sheets

US 7,643,273 B2

CONTROL DEVICE OF CONNECTION STUDS OF A COMPUTER

BACKGROUND OF THE INVENTION a) Field of the Invention

The present invention relates to a control device of connection studs of a computer, and more particularly to a control device that a base plate of computer casing is pre-built with a plurality of hexagonal grooves having through-holes at centers thereof, and studs with a hexagonal head are optionally transfixed into the specific hexagonal grooves and their through-holes, such that a number of fixed studs can be decreased, and an interference in installing parts of the computer casing can be eliminated.

b) Description of the Prior Art

Referring to FIG. 5, in a conventional computer casing, a base plate E is riveted with a plurality of fixed studs A, with a connection line A1 representing that the studs A are fixed and riveted with the base plate E as an integrated body. In other words, a center of the stud A is provided with an inner thread A2, such that the fixed stud A can be screwed with a through-hole C1 in a circuit board C of a constant length and width, through a bolt B, so as to fix the circuit board C on the base plate E. However, the base plate E should be pre-punched into the through-holes, and then the studs A are punched again to be riveted and fixed on the base plate E. Therefore, a surface of the base plate E should be protruded and fixed with a plenty of the studs A. When a size of circuit board C, and a number and locations of the through-holes C1 are different, such as a new circuit board C of different size is to be installed on the base plate E, the extra fixed studs which are not used will not be able to be removed, thereby forming a new interference, and being unable to screw and fix with the connection holes C1 on the new circuit board C. In particular, in the plurality of protruded fixed studs, the studs which are actually used are less than ⅔ of the total number, while the rest ⅓ are pre-configured. Therefore, the unused studs A may cause a great waste.

SUMMARY OF THE INVENTION

The primary object of present invention is to provide a control device of connection studs of a computer, wherein a base plate of a computer casing is punched into a plurality of hexagonal grooves at different distance, the groove is provided with a through-hole, hexagonal heads of a set of studs are loosely fitted into the hexagonal grooves, and rods of the studs are loosely transfixed into the through-holes to be screwed with a circuit board of different size, so as to effectively control a number of studs actually used for screwing, and to prevent the unnecessary studs, the circuit board, or other parts from resulting in an interference.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
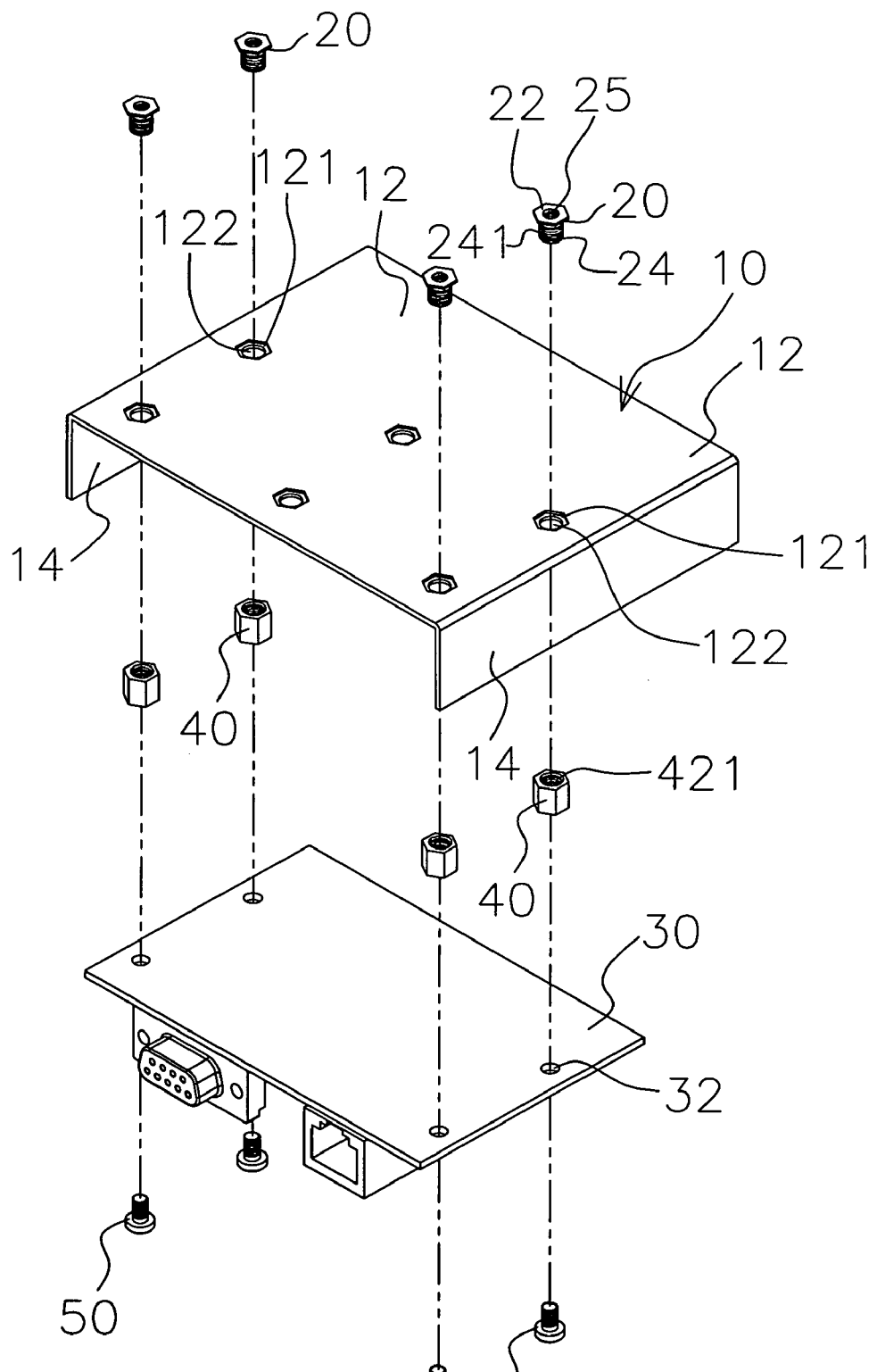
FIG. 1 shows an exploded view of parts of the present invention.
Figure 3:
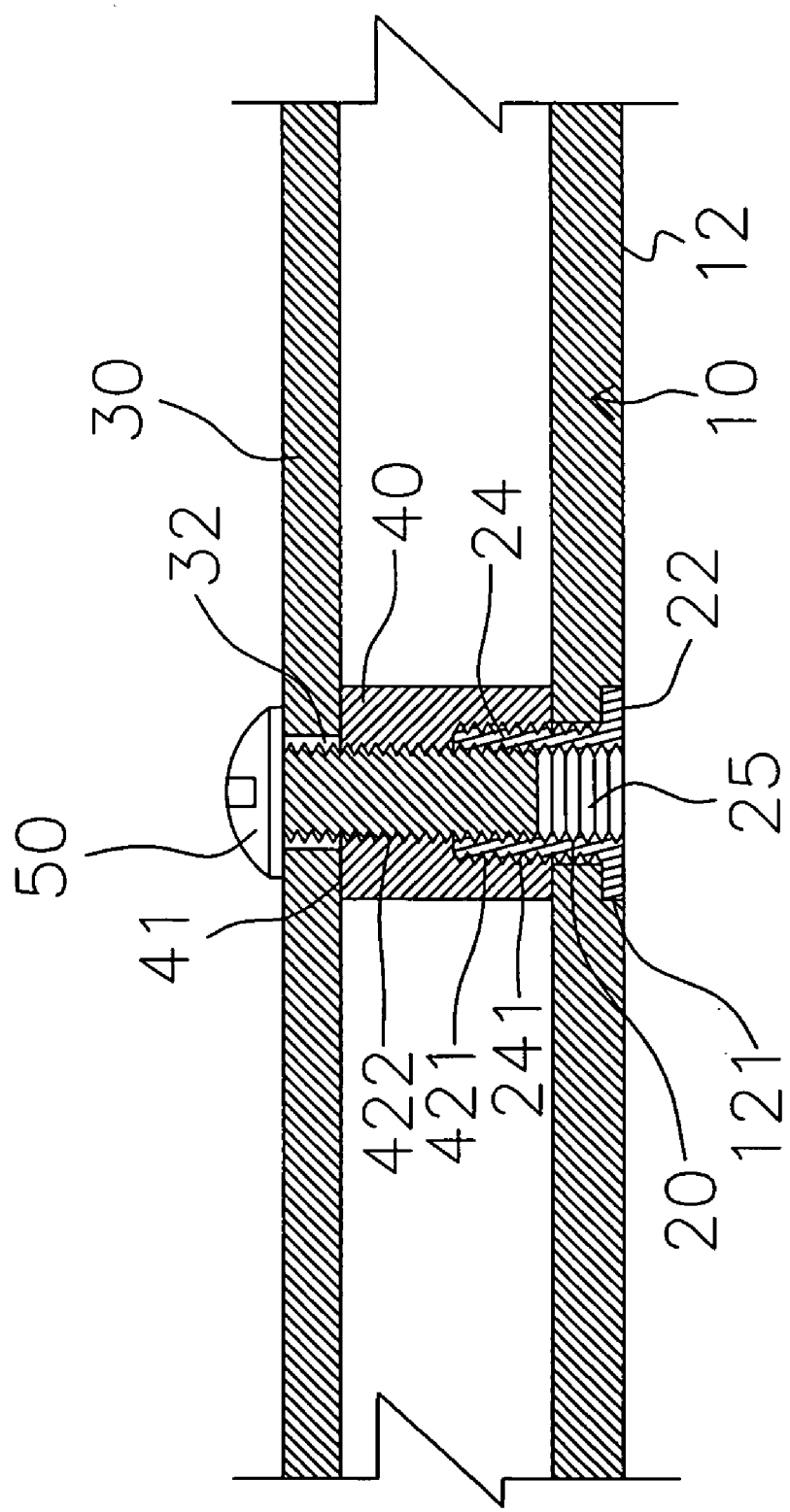
FIG. 3 shows a local cross sectional view of the present invention after being assembled.

Referring to FIG. 1, the present invention is to provide a control device of connection studs of a computer casing, including a computer casing 10 which is provided with a base plate 12 and vertical side plates 14 at peripheries, with a back surface of the base plate 12 being punched into a plurality of hexagonal grooves 121 at proper distances, and with a center of the hexagonal groove 121 being provided with a through-hole 122; a plurality of studs 20 which are provided with hexagonal heads 22 and rods 24, with a center of the rod 24 being provided with an inner screw-hole 25, the rod 24 being loosely transfixed into the through-hole 122, and the head 22 being loosely fitted into the hexagonal groove 121, such that the hexagonal heads 22 can be locked into the hexagonal grooves 121; a circuit board 30 on which is provided with a plurality of connection holes 32; and a plurality of nuts 40 which are provided with a pre-determined length, and a center of each of which is transfixed with a first inner screw-hole 422 and a second inner screw-hole 421 of different inner diameter, with the second inner screw-hole 421 being able to be screwed with an outer thread 241 of the rod 24 (as shown in FIG. 3) such that the heads 22 of studs 20 can be locked and positioned into the hexagonal grooves 121, and with bolts 50 being transfixed into the connection holes 32 and then being screwed into the first inner screw-hole 422 and the inner screw-hole 25 of rod 24, such that the circuit board 30 can be fixed at end parts 41 of the nuts 40 (as shown in FIG. 3).

The number of hexagonal grooves 121 and through-holes 12 is more than that of the connection holes 32 of circuit board 30.

Figure 4:
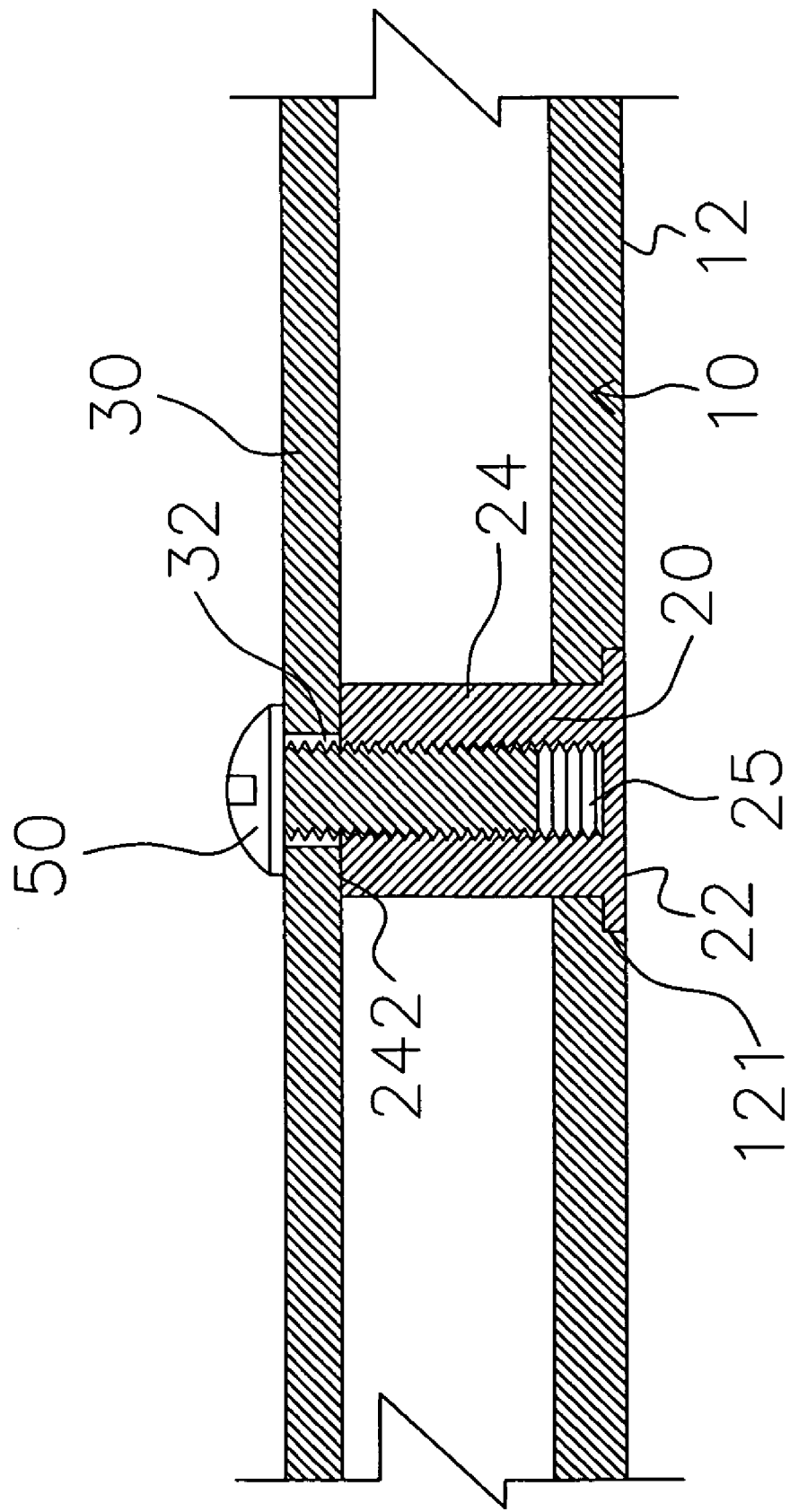
FIG. 4 shows a local cross sectional view of the present invention.
Figure 5:
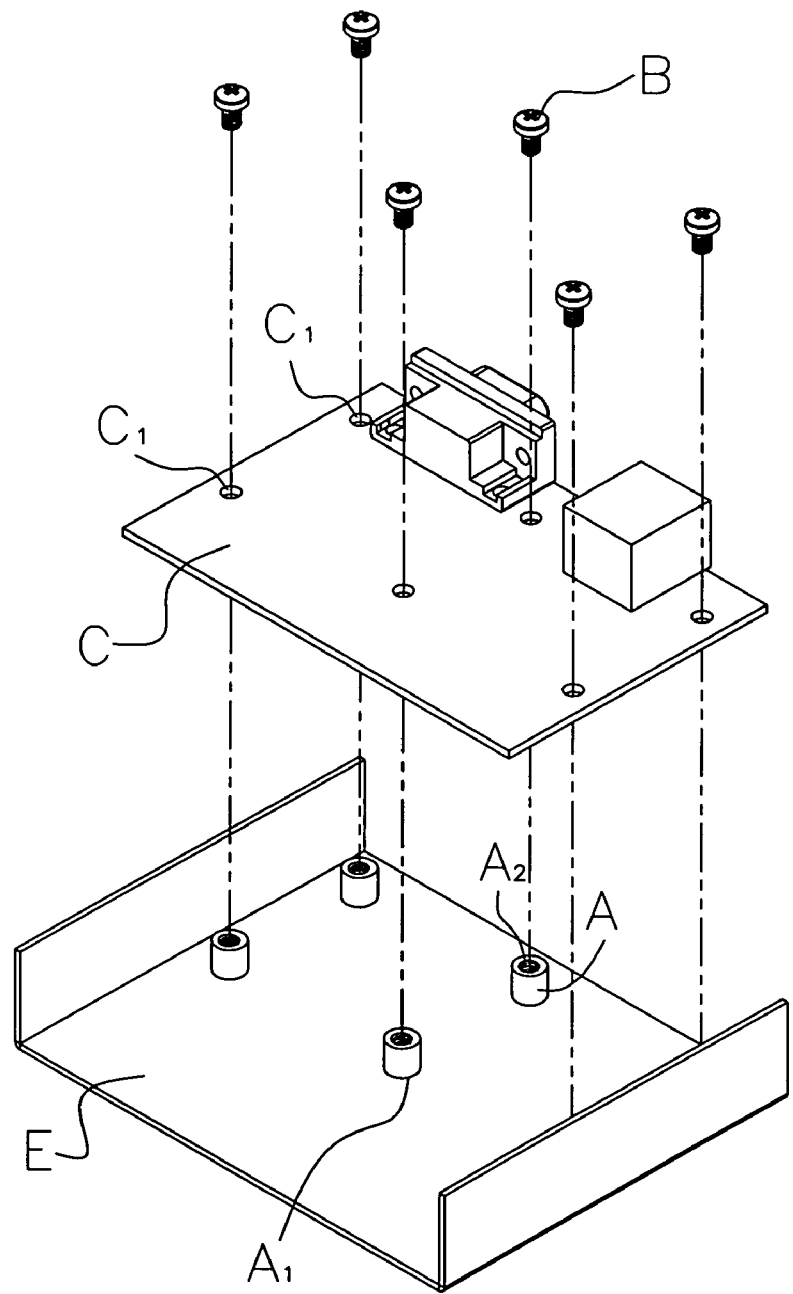
FIG. 5 shows an exploded view of parts of a prior art.

Referring to FIG. 4, the rod 24 of stud 20 is provided with a pre-determined height, its outer surface is not provided with a thread, and its center is provided with the inner screw-hole 25. The bolt 50 is transfixed into the connection hole 32 of circuit board 30 and is screwed into the inner screw-hole 25, the circuit board 30 is fixed at an end part 242 of the rod 24, and the hexagonal head 22 is locked into the hexagonal groove 121 (as shown in FIG. 4).

Referring to FIG. 1, according to a designer's requirement, a back surface of a base plate 12 of a computer casing 10 is punched into a plurality of hexagonal grooves 121 and through-holes 122 at proper distances, and a circuit board 30 is provided with a plurality of connection holes 32. The number of hexagonal grooves 121 and through-holes 122 can be more than that of the connection holes 32, hexagonal heads 22 of studs 20 are loosely sheathed into the hexagonal grooves 121, and are pressed and positioned by human fingers. Next, a second inner thread 421 of a nut 40 is screwed into an outer thread 241 of a rod 24, such that the stud 20 can be locked and positioned into the hexagonal groove 12, and the hexagonal head 22 of stud 20 can be positioned into the hexagonal groove 12, without being rotated due to an action of external force.

According to the number and positions of connection holes 32, corresponding hexagonal grooves 121 can be used by screwing the studs 20 with the nuts 40. In other words, the back surface of base plate 12 can be pre-punched into more hexagonal grooves 121 and through-holes 122 which are distributed at each position on the back surface of base plate 12. For the circuit board 30 of different size, the number and positions of its connection holes 32 are not exactly the same;

but the plural connection holes 32 can all be corresponding to any one of the hexagonal grooves 121. Therefore, a user can use a certain number and positions of hexagonal grooves 121 and through-holes 122 in the base plate 12 to provide for a screwing with the nuts 40 and for connecting with the connection holes 32 of circuit board 30. Accordingly, one function is achieved, that is, the unused hexagonal grooves 121 and through-holes 122 do not have any screwing behavior and therefore there will be no shortcoming of the prior art in which there is still fixed with protruded and extra unused studs. Therefore, the studs 20 and nuts 40 will not be blindly connected and fixed on the base plate 12 without a purpose, thereby accurately controlling the number of studs 20 to be used.

The bolts 50 are transfixed into the connection holes 32, and are further screwed into the first inner screw-holes 422 and the inner screw-holes 25, such that the circuit board 30 can be fixed at the end parts 41 of nuts 40 (as shown in FIG. 3). As the unused hexagonal grooves 121 and through-holes 122 on the base plate 12 are not fixed with the studs like the prior art, they will not interfere with the circuit board 30 or other parts.

Figure 2:
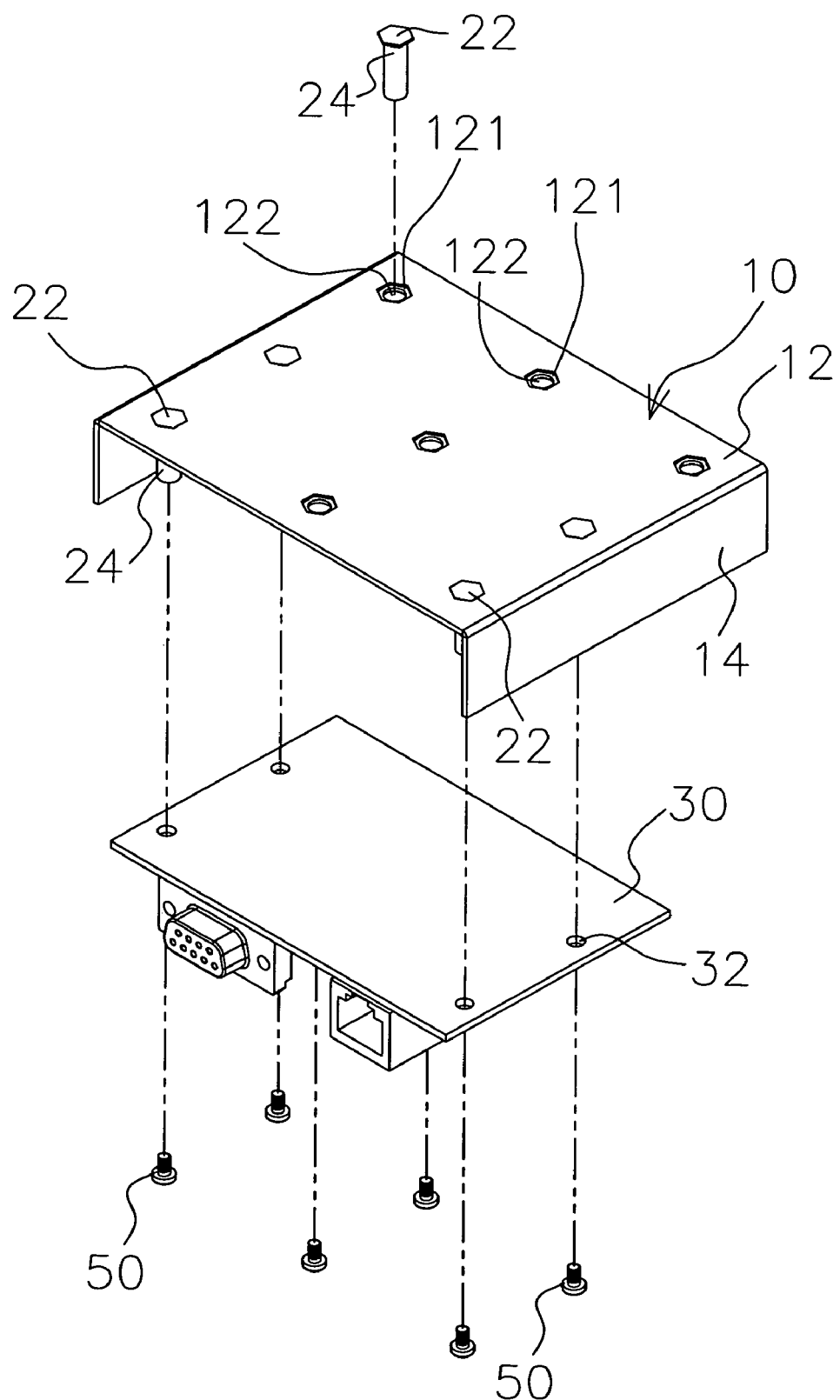
FIG. 2 shows another exploded view of parts of the present invention.

Referring to FIG. 2 and FIG. 4, an outer surface of the rod 24 is not provided a thread, and the inner screw-hole 25 is not transfixed but with an elongated length; therefore, the bolts 50 can be directly transfixed into the connection holes 32 and screwed into the screw-holes 25. At this time, the circuit board 30 is fixed above the base plate 12, and the hexagonal heads 22 are loosely connected and locked into the hexagonal grooves 121.

When the bolts 50 of present invention are disassembled from the inner screw-holes 25, the old circuit board 30 can be taken out, and the studs 20 can be removed by hands at an exterior of the base plate 12. At this time, there will be no protruded studs on the base plate 12, and therefore another new circuit board 30 of different specification can be optionally connected and fixed.

Accordingly, through the studs 20 which can be loosely connected on or disassembled from the base plate 12 at will, the unnecessary provision and fixation of the studs can be prevented, which can accurately and effectively use and control the number of studs without wasting the studs 20, nuts 40, and bolts 50, and will not interfere with the circuit board or other parts like the prior art of fixed, extra, and protruded studs.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A control device of connection studs of a computer, comprising:
   a computer casing which is provided with a base plate and vertical side plates at peripheries, with a back surface of the base plate being punched into a plurality of hexagonal grooves at proper distances, and with a center of the hexagonal groove being provided with a through-hole; a plurality of studs which are provided with hexagonal heads and rods, with a center of the rod being provided with an inner screw-hole, the rod being loosely transfixed into the through-hole, and the head being loosely fitted into the hexagonal groove, such that the hexagonal heads are locked into the hexagonal grooves; a circuit board on which is provided with a plurality of connection holes; and a plurality of nuts which are provided with a pre-determined length, and a center of each of which is transfixed with a first inner screw-hole and a second inner screw-hole of different inner diameter, with the second inner screw-hole being screwed with an outer thread of the rod such that the heads of studs are locked and positioned into the hexagonal grooves, and with bolts being transfixed into the connection holes and then being screwed into the first inner screw-hole and the inner screw-hole of rod, such that the circuit board is fixed at end parts of the nuts.

2. The control device of connection studs of a computer according to claim 1, wherein the number of hexagonal grooves and through-holes is more than that of the connection holes installed on the circuit board.

3. The control device of connection studs of a computer according to claim 1, wherein the rods of studs are provided with a pre-determined height, their outer surfaces are not provided with a thread, and their centers are provided with the inner screw-hole; the bolts being transfixed into the connection holes of circuit board and being screwed into the inner screw-holes, the circuit board being fixed at the end parts of rods, and the hexagonal heads being locked into the hexagonal grooves.

* * * * *